(12) United States Patent
Schober

(10) Patent No.: US 6,552,422 B1
(45) Date of Patent: Apr. 22, 2003

(54) DATA CARRIER WITH AN INTEGRATED ELECTRONIC COMPONENT AND WITH A TRANSMISSION COIL WHICH COMPRISES TURN PORTIONS ARRANGED DIRECTLY AGAINST SAID COMPONENT

(75) Inventor: Joachim Heinz Schober, Graz (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 108 days.

(21) Appl. No.: 09/649,673

(22) Filed: Aug. 28, 2000

(30) Foreign Application Priority Data

Aug. 31, 1999 (EP) .............................. 99890279

(51) Int. Cl.[7] .................... H04B 5/02; G06K 19/00; G06K 19/077

(52) U.S. Cl. .................. 257/679; 257/691; 257/664; 257/662; 257/663; 361/767; 235/492; 235/487; 235/384; 235/449; 235/451

(58) Field of Search .................. 257/679, 662–664, 257/691; 361/767; 235/492, 487, 488, 449, 451, 384

(56) References Cited

U.S. PATENT DOCUMENTS

| | | | | |
|---|---|---|---|---|
| 4,857,893 A | * | 8/1989 | Carroll | 340/572 |
| 5,705,852 A | | 1/1998 | Orihara et al. | 257/679 |
| 5,800,763 A | * | 9/1998 | Hoppe et al. | 264/255 |
| 5,856,662 A | * | 1/1999 | Kohama et al. | 235/492 |
| 6,173,899 B1 | * | 1/2001 | Rozin | 235/492 |
| 6,180,434 B1 | * | 1/2001 | Lange et al. | 438/106 |
| 6,276,609 B1 | * | 8/2001 | Czar et al. | 257/679 |
| 6,285,561 B1 | * | 9/2001 | Aflenzer et al. | 257/662 |
| 2001/0011685 A1 | * | 8/2001 | Fries et al. | 235/492 |

FOREIGN PATENT DOCUMENTS

| | | | | |
|---|---|---|---|---|
| FR | 2756648 | * | 11/1996 | |
| FR | 2756648 | | 6/1998 | G06K/19/077 |
| WO | WO 99/05647 | * | 7/1998 | |

* cited by examiner

Primary Examiner—Alexander O. Williams
(74) Attorney, Agent, or Firm—Jack D. Slobod

(57) ABSTRACT

In a data carrier (1) with an integrated electronic component (3) and with a transmission coil (12), short turn portions (21, 22, 23, 24, and 25) of the transmission coil (12) are formed by connection lines which are provided on the integrated electronic component (3) in the area of a component surface (4) of the integrated electronic component (3) and which are preferably formed by conductor tracks.

10 Claims, 3 Drawing Sheets

DATA CARRIER WITH AN INTEGRATED ELECTRONIC COMPONENT AND WITH A TRANSMISSION COIL WHICH COMPRISES TURN PORTIONS ARRANGED DIRECTLY AGAINST SAID COMPONENT

BACKGROUND OF THE INVENTION

1. Field of the Invention

The invention relates to a data carrier. The invention further relates to an integrated electronic component and a transmission coil accommodated in a carrier body of a data carrier.

2. Description of the Related Art

Such a data carrier and such an integrated electronic component are known, for example, from the patent document U.S. Pat. No. 5,705,852A. Special reference is to be made here to the embodiment disclosed in FIG. 3 of this patent document and the corresponding description. In the known embodiment, in which n coil turns are provided, (n-1) coil turns are to be passed underneath the integrated electronic circuit between the coil contacts and between the connection contacts, as seen in a direction perpendicular to the component surface. This is possible only in that the coil turns have very narrow dimensions at least in the region of their short turn portions which lie between the coil contacts and the connection contacts, and have very small interspacings between them. This may lead to comparatively great difficulties in the manufacture of the coil and also in the manufacture of the electrically conductive connections between the coil contacts and the connection contacts to the integrated electronic component, which is undesirable. Furthermore, there is the problem in the known arrangement that—given the fact that it is almost always the case in practice that adjacent to the connection contacts also further contact surfaces are provided on the component surface of the integrated electronic component, for example contact surfaces for carrying out tests and/or contact surfaces of a contacted interface—these additional contact surfaces can comparatively easily lead to short-circuits in the region of the short turn portions of the coil turns passed through between the coil contacts and the connection contacts, which adversely affects, and in the worst case entirely prevents a faultless operation, and which is accordingly also undesirable.

SUMMARY OF THE INVENTION

The invention has for its object to avoid the above difficulties in a simple manner and by particularly simple means and to realize an improved data carrier and an improved integrated electronic component.

To achieve the above object, a data carrier with a carrier body accommodating an integrated electronic component and a transmission coil is provided. The integrated electronic component includes a component surface and is provided with two connection contacts in the region of the component surface, which contacts lie at a distance from one another. The transmission coil includes two coil contacts which lie at a distance from one another and which are connected with electrical conduction to the connection contacts of the integrated electronic component. The transmission coil has coil turns which electrically interconnect the two coil contacts and which furthermore include short turn portions which, when viewed in a direction perpendicular to the component surface, extend between the two coil contacts lying at a distance from one another and between the two connection contacts lying at a distance from one another. The transmission coil further has long turn portions which are each connected with electrical conduction to at least one short turn portion of the transmission coil characterized in that the short turn portions extending between the two coil contacts and between the two connection contacts are formed by connection lines which are provided on the integrated electronic component in the area of the component surface.

The provision of the characteristics according to the invention achieves in a particularly simple manner and by particularly simple means which involve practically no additional expenditure that the short turn portions of the coil turns of the transmission coil which lie between the connection contacts and between the coil contacts can have a very narrow shape and can be arranged with a high packing density, while being exactly delimited relative to additionally provided contact surfaces in the region of the component surface, so that the risk of undesirable short-circuits is avoided with certainty.

The above and further aspects of the invention will become apparent from the description of embodiments given below and are clarified with reference to these embodiments.

BRIEF DESCRIPTION OF THE DRAWINGS

The invention will now be described in more detail below with reference to three embodiments shown in the drawings, to which, however, the invention is by no means limited.

DETAILED DESCRIPTION OF THE INVENTION

Figure 1:
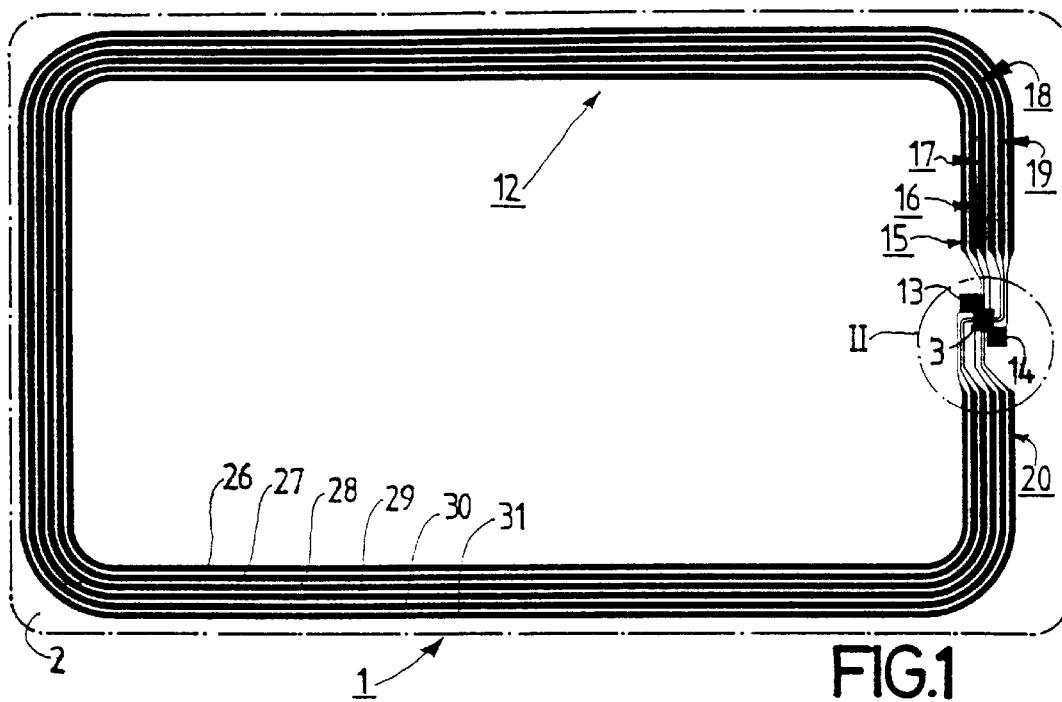
FIG. 1 is a plan view on an enlarged scale of a data carrier according to a first embodiment of the invention, comprising an integrated electronic component according to a first embodiment of the invention.
Figure 2:
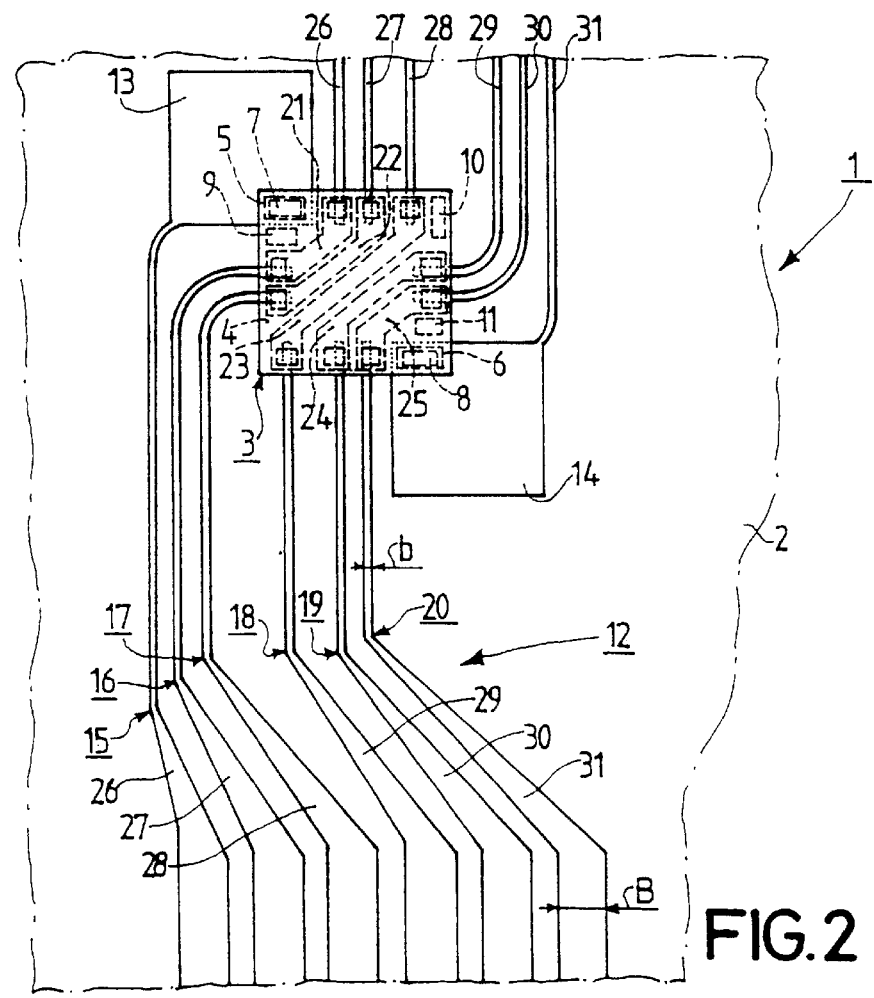
FIG. 2 shows a detail of the data carrier of FIG. 1 as indicated with a circle II in FIG. 1, comprising the integrated electronic component of the first embodiment of the invention.

In FIG. 1, a data carrier 1 is indicated with a dash-dot line. This data carrier 1 is a card-type data carrier which is often referred to as chip card. The data carrier 1 comprises a carrier body 2 which is represented in FIGS. 1 and 2 in a manner as if the carrier body 2 were made from a transparent material. The carrier body 2 in the present case was manufactured in an injection-molding process. The carrier body 2, however, may also be manufactured from a plurality of foils which were joined together in a lamination process.

An integrated electronic component 3 is accommodated in the carrier body 2 of the data carrier 1. The integrated component 3 has a component surface 4 which is covered by the integrated component 3 in the representation of FIGS. 1 and 2 and is accordingly invisible, but which is visible in the representation shown in FIG. 3. The integrated component 3 is provided with two connection contacts 5 and 6, which lie at a distance from one another, in the region of the component surface 4. The two connection contacts 5 and 6 are formed by contact surfaces 5 and 6 here, also often referred to as pads. The contact surfaces 5 and 6 in the present case consist mainly of aluminum with additives in small quantities. A contact elevation 7, 8 is connected to each contact surface 5, 6, respectively. Such contact elevations are often referred to as bumps. The bumps 7 and 8 in the present case are made of gold. The bumps 7 and 8 may alternatively be made from other metals (for example, tin, nickel, or palladium) or from a conductive glue.

The integrated component 3 is additionally provided with test contact surfaces 9, 10 and 11 on the component surface 4. No bumps are provided on the three test contact surfaces 9, 10, and 11 in this case. An embodiment with bumps may alternatively be chosen, however. Procedures for testing the integrated component 3 may be carried out through the three test contact surfaces 9, 10, and 11.

A transmission coil 12, shown in its entirety in FIG. 1, is furthermore accommodated in the carrier body 2. The transmission coil 12 comprises a first coil contact 13 and a second coil contact 14. The two coil contacts 13 and 14 lie at a distance from one another. The first coil contact 13 is connected with electrical conduction to the first connection contact 5 via the first bump 7. The second coil contact 14 is connected with electrical conduction to the second connection contact 6 via the second bump 8. The transmission coil 12 further comprises coil turns, i.e. a first coil turn 15, a second coil turn 16, a third coil turn 17, a fourth coil turn 18, a fifth coil turn 19, and a sixth coil turn 20. The two coil contacts 13 and 14 are electrically interconnected through the six coil turns 15 to 20. Such a transmission coil may alternatively comprise fewer or more coil turns than six coil turns.

Each of the five coil turns 15, 16, 17, 18, and 19 comprises a short turn portion 21, 22, 23, 24, and 25, respectively. The short coil turn portions 21, 22, 23, 24, and 25, when viewed in a direction transverse to the component surface 4, extend between the two coil contacts 13 and 14 lying at a distance from one another and between the two connection contacts 5 and 6 lying at a distance from one another. Furthermore, each of the six coil turns 15, 16, 17, 18, 19, and 20 comprises a respective long turn portion 26, 27, 28, 29, 30, and 31. The long turn portions 26 to 31 of the coil turns 15 to 20 and the coil contacts 13 and 14 were made in an etching process in the present case, but they may alternatively be manufactured in a silk-screen printing process. Other methods known in printed circuit technology may also be used for forming the long turn portions 26 to 31, the coil turns 15 to 20, and the coil contacts 13 and 14 of the transmission coil 12. The long turn portions 26 to 31 of the coil turns 15 to 20 have a constant, comparatively great width B over the major portion of their length, as is well visible in FIG. 1. The long turn portions 26 to 31 are thinner only in the region adjoining the integrated electronic component 3, where they have a comparatively small width b, as is visible in FIG. 1 and in particular in FIG. 2.

The first long turn portion 26 is connected at one end to the first coil contact 13 and at the other end to the first short turn portion 21 with electrical conduction. The second long turn portion 27 is connected at one end to the first short turn portion 21 and at the other end to the second short turn portion 22. The third long turn portion 28 is connected at one end to the second short turn portion 22 and at the other end to the third short turn portion 23 with electrical conduction. The fourth long turn portion 29 is connected at one end to the third short turn portion 23 and at the other end to the fourth short turn portion 24 with electrical conduction. The fifth long turn portion 30 is connected at one end to the fourth short turn portion 24 and at the other end to the fifth short turn portion 25 with electrical conduction. The sixth long turn portion 31 is connected at one end to the fifth short turn portion 25 and at the other end to the second coil contact 14 with electrical conduction.

In the data carrier 1 of FIGS. 1 and 2 and in the integrated electronic component 3 of the data carrier 1, the short turn portions 21, 22, 23, 24, and 25 of the transmission coil 12 arranged between the two coil contacts 13 and 14 and between the two connection contacts 5 and 6 are formed in a particularly advantageous manner by connection lines 21, 22, 23, 24, and 25 which are provided on the integrated electronic component 3 in the region of the component surface 4. Each of these connection lines 21 to 25 is here formed by a conductor track manufactured in integrated circuit technology. In the present case, all five conductor tracks serving as connection lines 21 to 25 follow an oblique path. This offers the advantage that a favorable space utilization is achieved.

Figure 3:
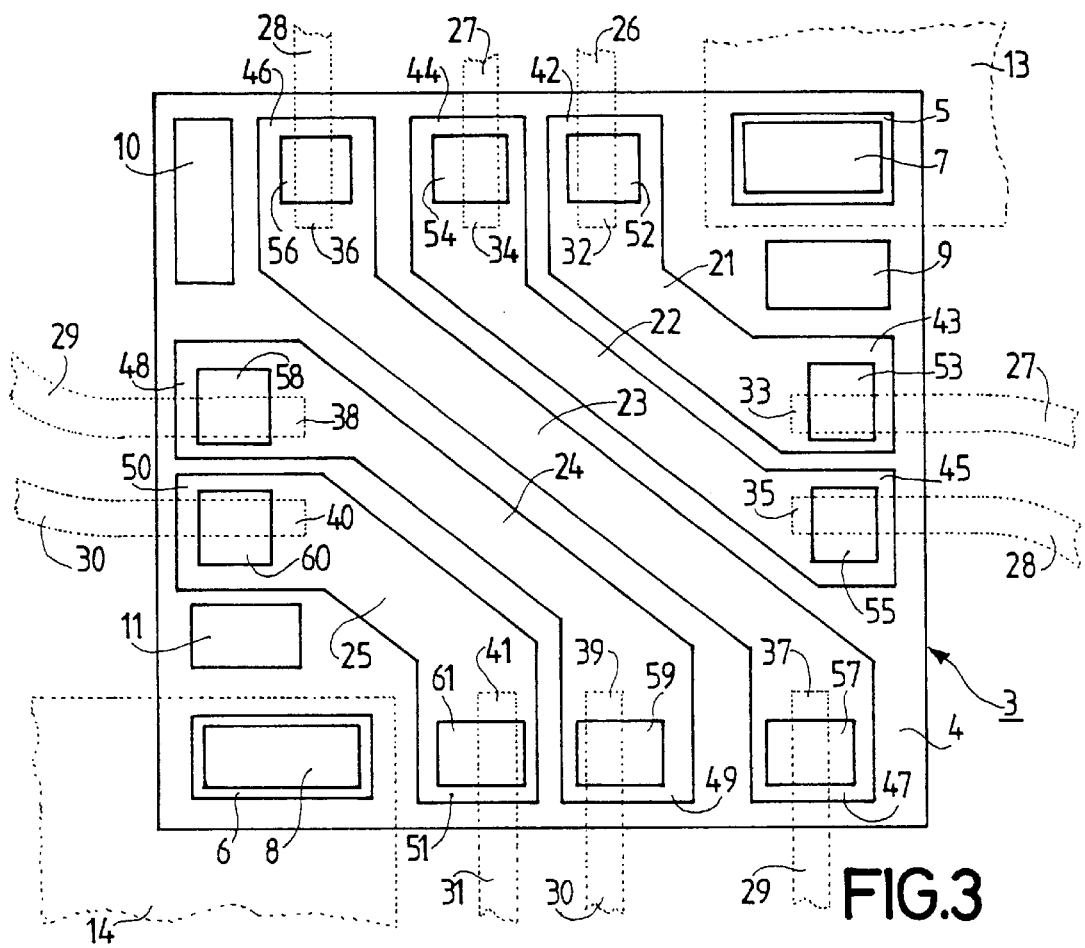
FIG. 3 is a plan view from below of the integrated electronic component representing the first embodiment of the invention, which is accommodated in the data carrier shown in FIGS. 1 and 2.

It is to be noted that the long turn portions 26 to 31 are fully embedded in the carrier body 2 for the major part in the data carrier 1 of FIGS. 1 and 2, and that the long turn portions 26 to 31 comprise portion ends 32, 33, 34, 35, 36, 37, 38, 39, 40, and 41, which are partly not embedded in the carrier body 2, on the side facing the integrated electronic circuit 3, and that the portion ends 32 to 41 of the long turn portions 26 to 31 are connected with electrical conduction to the line ends 42, 43, 44, 45, 46, 47, 48, 49, 50, and 51 of the connection lines 21, 22, 23, 24, and 25. To keep the drawing of FIG. 2 clear, the portion ends 32 to 41 of the long turn portions 26 to 31 lying under the integrated electronic circuit 3 are shown in broken lines. Similarly, the portions of the two coil contacts 13 and 14 are shown in broken lines where they lie under the integrated electronic component 3 in FIG. 2. In FIG. 3, which only shows the integrated component 3 of the data carrier 1 of FIGS. 1 and 2, the coil contacts 13 and 14 shown in part as well as the long turn portions shown in part are represented by dotted lines. The short turn portions 21 to 25, i.e. the connection lines 21 to 25 each formed by a conductor track, are connected to respective bump contacts 52, 53, 54, 55, 56, 57, 58, 59, 60, and 61 in the regions of their line ends 42 to 51 for the purpose of achieving the electrically conducting connections between the long turn portions 26 to 31 and the short turn portions 21 to 25.

As is apparent particularly from FIG. 3, the short turn portions 21 to 25 of the coil turns 15 to 20 are arranged with a high packing density between the two connection contacts 5 and 6 and between the two coil contacts 13 and 14 in the integrated component 3 and accordingly in the data carrier 1, and they are exactly delimited with respect to one another and with respect to the additionally provided test contact surfaces 9, 10, and 11 in the region of the component surface 4. The risk of undesirable short-circuits arising in the region of the short turn portions 21 to 25 is reliably prevented thereby in a simple manner.

Figure 4:
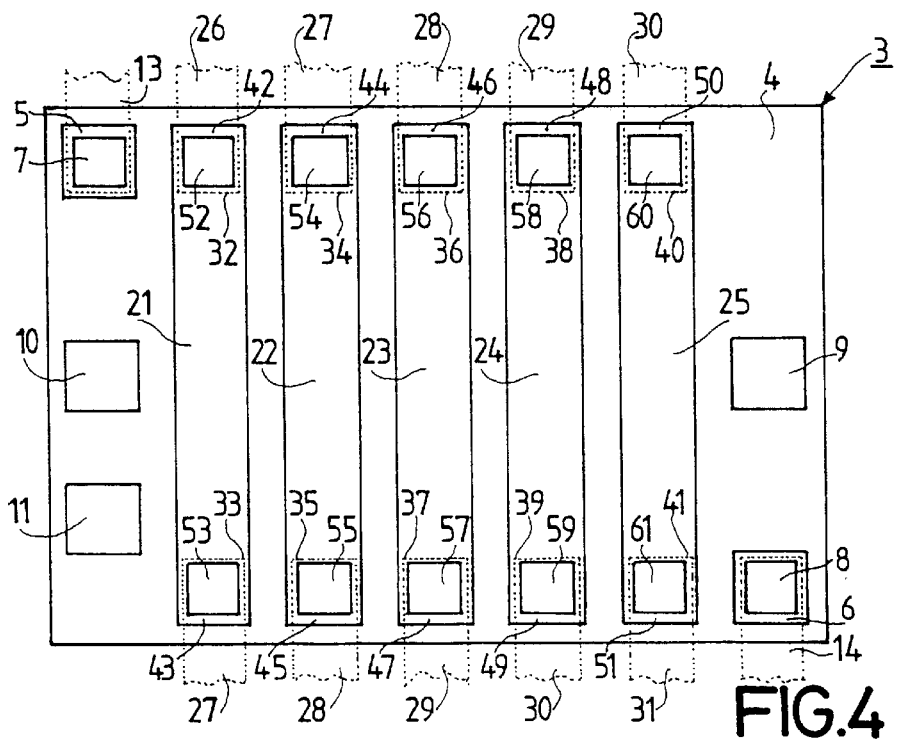
FIG. 4 shows in a similar manner as FIG. 3 an integrated electronic component in a second embodiment of the invention.

The integrated electronic component 3 shown in FIG. 4 has in principle the same construction as the integrated electronic component 3 of FIG. 3, but in the integrated electronic component 3 of FIG. 4 all conductor tracks provided as the connection lines 21 to 25, i.e. the short turn portions 21 to 25 follow rectilinear paths.

Figure 5:
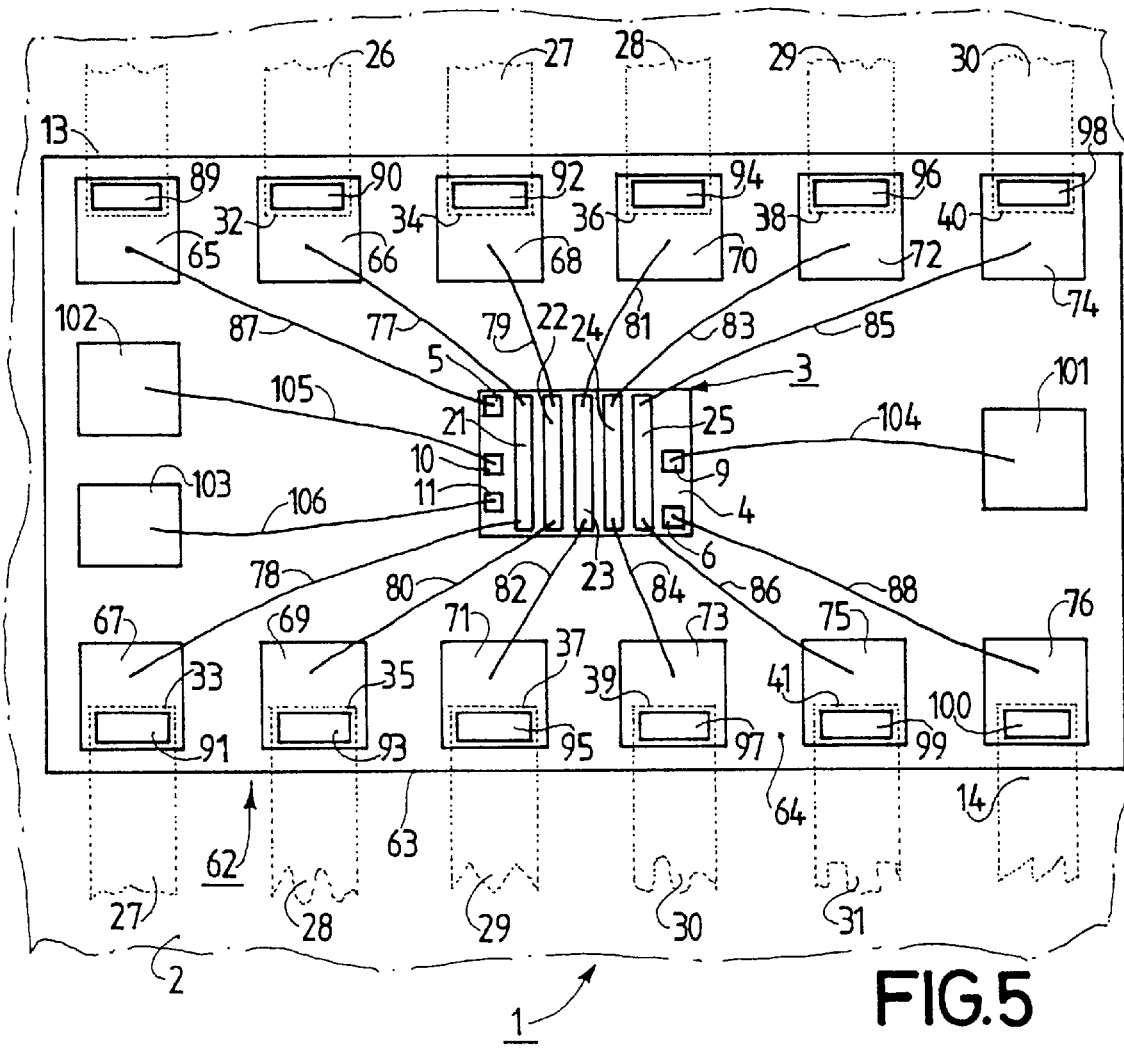
FIG. 5 shows in a similar manner as FIGS. 3 and 4, but on a smaller scale, an integrated component in a third embodiment of the invention, which forms part of a module shown in FIG. 5.

FIG. 5 shows a module 62 which is accommodated in a data carrier 1 which is again indicated with a dash-dot line in FIG. 5. The module 62 comprises as a component an integrated electronic component 3 which corresponds substantially to the integrated electronic component 3 of FIG. 4 and which differs from the integrated electronic component 3 of FIG. 4 only in that the ends of the connection lines 21, 22, 23, 24, and 25 and the connection contacts 5 and 6 have no bumps.

The module 62 comprises a component carrier 63. The component carrier 63 has a carrier surface 64 on which the integrated electronic component 3 is provided. Intermediate contacts 65, 66, 67, 78, 69, 70, 71, 72, 73, 74, 75, and 76 formed by contact surfaces are provided on the carrier surface 64, of which the intermediate contacts 66 to 75 are each connected with electrical conduction both to a respective portion end 32, 33, 34, 35, 36, 37, 38, 39, 40, and 41 of a long turn portion 26, 27, 28, 29, and 30 and to a respective line end 42, 43, 44, 45, 46, 47, 48, 49, 50, and 51 of a connection line 21, 22, 23, 24, and 25. The electrically conducting connection is here formed by a respective bonding wire 77, 78, 79, 80, 81, 82, 83, 84, 85, and 86. It should be noted that the intermediate contact 65, which is connected with electrical conduction to the first coil contact 13, is connected with electrical conduction to the first connection contact 5 via a further bonding wire 87. The intermediate contact 76, which is connected with electrical conduction to the second coil contact 14, is connected to the second connection contact 6 with electrical conduction via a further bonding wire 88. It should finally be noted that the intermediate contacts 65 to 76 in this case are each provided with a respective bump 89, 90, 91, 92, 93, 94, 95, 96, 97, 98, 99, and 100. These intermediate contacts 65 to 76 are more often not provided with bumps.

Three further intermediate contacts 101, 102, and 103, each formed by a contact surface, are furthermore provided on the carrier surface 64. The intermediate contact 101 is here connected to the test contact surface 9 of the integrated component 3 via a further bonding wire 104. The intermediate contact 102 is connected to the test contact surface 10 of the integrated component 3 via a further bonding wire 105. The intermediate contact 103 is connected to the test contact surface 11 of the integrated component 3 via a further bonding wire 106.

The embodiments of FIGS. 4 and 5 lead to the same advantages which were explained above with reference to the data carrier 1 shown in FIGS. 1 and 2 and with reference to the integrated electronic component 3 thereof.

What is claimed is:

1. A data carrier, comprising:
    a carrier body;
    an integrated electronic component accommodated on said carrier body, said integrated electronic component including
    a component surface defining a first component corner and a second component corner diagonally opposing said first component corner,
    a first connection contact in a region of said first component corner,
    a second connection contact in a region of said second component corner, wherein a distance between said first connection contact and said second connection contact is maximized, and
    one or more connection lines in an area of said component surface between said first connection contact and said second connection contact; and
    a transmission coil accommodated on said carrier body, said transmission coil including
    a first coil contact electrically interconnected to said first connection contact,
    a second coil contact electrically interconnected to said second connection contact, and
    a plurality of turn portions electrically interconnected to said first coil contact, said second coil contact, and said one or more connection lines.

2. The data carrier of claim 1, further comprising:
    a module including
    a component carrier having a carrier surface accommodating said integrated electronic component, and
    a plurality of intermediate contacts and bond wires electrically interconnecting said first coil contact to said first connection contact, said second coil to said second connection contact, and said plurality of turn portions to said one or more connection lines.

3. The data carrier of claim 2,
    wherein said carrier surface defines a first carrier corner and a second carrier corner diagonally opposing said first carrier corner;
    wherein a first bond wire electrically interconnects a first intermediate contact in a region of said first carrier corner to said first connection contact; and
    wherein a second bond wire electrically interconnects a second intermediate contact in a region of said second carrier corner to said second connection contact.

4. A data carrier, comprising:
    a carrier body;
    an integrated electronic component accommodated on said carrier body, said integrated electronic component including
    a component surface defining a first component corner and a second component corner diagonally opposing said first component corner,
    a first connection contact in a region of said first component corner,
    a second connection contact in a region of said second component corner, wherein a distance between said first connection contact and said second connection contact is maximized, and
    one or more connection lines in an area of said component surface between said first connection contact and said second connection contact, said one or more connection lines being unconnected to said first connection contact and said second connection contact; and
    a transmission coil accommodated on said carrier body, said transmission coil including
    a first coil contact electrically interconnected to said first connection contact,
    a second coil contact electrically interconnected to said second connection contact,
    a plurality of turn portions electrically interconnected to said first coil contact, said second coil contact, and said one or more connection lines.

5. The data carrier of claim 4, further comprising:
    a module including
    a component carrier having a carrier surface accommodating said integrated electronic component, and
    a plurality of intermediate contacts and bond wires electrically interconnecting said first coil contact to said first connection contact, said second coil to said second connection contact, and said plurality of turn portions to said one or more connection lines.

6. The data carrier of claim 5, wherein said carrier surface defines a first carrier corner and a second carrier corner diagonally opposing said first carrier corner;

wherein a first bond wire electrically interconnects a first intermediate contact in a region of said first carrier corner to said first connection contact; and wherein a second bond wire electrically interconnects a second intermediate contact in a region of said second carrier corner to said second connection contact.

7. A data carrier, comprising:

a carrier body;

an integrated electronic component accommodated on said carrier body, said integrated electronic component including a component surface defining a first component corner and a second component corner diagonally opposing said first component corner, a first connection contact in a region of said first component corner, a second connection contact in a region of said second component corner, wherein a distance between said first connection contact and said second connection contact is maximized, and one or more connection lines in an area of said component surface between said first connection contact and said second connection contact; and a transmission coil accommodated on said carrier body, said transmission coil including a first coil contact having a portion beneath and electrically interconnected to said first connection contact, a second coil contact having a portion beneath and electrically interconnected to said second connection contact, a plurality of turn portions electrically interconnected to said first coil contact, said second coil contact, and said one or more connection lines.

8. The data carrier of claim 7, wherein said one or more connection lines are unconnected to said first connection contact and said second connection contact.

9. The data carrier of claim 7, further comprising:

a module including a component carrier having a carrier surface accommodating said integrated electronic component, and a plurality of intermediate contacts and bond wires electrically interconnecting said first coil contact to said first connection contact, said second coil to said second connection contact, and said plurality of turn portions to said one or more connection lines 4.1.

10. The data carrier of claim 9, wherein said carrier surface defines a first carrier corner and a second carrier corner diagonally opposing said first carrier corner;

wherein a first bond wire electrically interconnects a first intermediate contact in a region of said first carrier corner to said first connection contact; and wherein a second bond wire electrically interconnects a second intermediate contact in a region of said second carrier corner to said second connection contact.

* * * * *